US011955333B2

(12) United States Patent
Tannos et al.

(10) Patent No.: US 11,955,333 B2
(45) Date of Patent: Apr. 9, 2024

(54) METHODS AND APPARATUS FOR PROCESSING A SUBSTRATE

(71) Applicant: Applied Materials, Inc., Santa Clara, CA (US)

(72) Inventors: Jethro Tannos, San Jose, CA (US); Bhargav Sridhar Citla, Fremont, CA (US); Srinivas D. Nemani, Saratoga, CA (US); Ellie Yieh, San Jose, CA (US); Joshua Alan Rubnitz, Monte Sereno, CA (US); Erica Chen, Santa Clara, CA (US); Soham Sunjay Asrani, San Jose, CA (US); Nikolaos Bekiaris, Campbell, CA (US); Douglas Arthur Buchberger, Jr., Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 474 days.

(21) Appl. No.: 17/208,719

(22) Filed: Mar. 22, 2021

(65) Prior Publication Data
US 2022/0301867 A1 Sep. 22, 2022

(51) Int. Cl.
*H01J 37/32* (2006.01)
*C23C 16/40* (2006.01)
(Continued)

(52) U.S. Cl.
CPC ...... *H01L 21/02326* (2013.01); *C23C 16/401* (2013.01); *C23C 16/4584* (2013.01);
(Continued)

(58) Field of Classification Search
CPC ......... H01L 21/02326; H01L 21/02164; H01L 21/02208; H01L 21/02274; C23C 16/401; C23C 16/505; C23C 16/56
See application file for complete search history.

(56) References Cited

U.S. PATENT DOCUMENTS

| 7,084,832 B2 | 8/2006 | Pribyl |
| 7,100,632 B2 | 9/2006 | Pribyl |

(Continued)

FOREIGN PATENT DOCUMENTS

| WO | WO 2020/223737 A2 | 11/2020 |
| WO | WO 2020/247548 A1 | 12/2020 |

OTHER PUBLICATIONS

PCT International Search Report and Written Opinion for PCT/US2022/015222 dated May 23, 2022.

*Primary Examiner* — Walter H Swanson
(74) *Attorney, Agent, or Firm* — Moser Taboa

(57) ABSTRACT

Methods and apparatus for processing a substrate are provided herein. For example, a method includes supplying a vaporized precursor into a processing volume, supplying activated elements including ions and radicals from a remote plasma source, energizing the activated elements using RF source power at a first duty cycle to react with the vaporized precursor to deposit an $SiNH_x$ film onto a substrate disposed in the processing volume, supplying a first process gas from the remote plasma source while providing RF bias power at a second duty cycle different from the first duty cycle to the substrate support to convert the $SiNH_x$ film to an SiOx film, supplying a process gas mixture formed from a second process gas supplied from the remote plasma source and a third process gas supplied from the gas supply while providing RF bias power at the second duty cycle to the substrate support, and annealing the substrate.

18 Claims, 3 Drawing Sheets

(51) Int. Cl.
    *C23C 16/458*     (2006.01)
    *C23C 16/505*     (2006.01)
    *C23C 16/52*     (2006.01)
    *C23C 16/56*     (2006.01)
    *H01L 21/02*     (2006.01)

(52) U.S. Cl.
CPC ............ *C23C 16/505* (2013.01); *C23C 16/52* (2013.01); *C23C 16/56* (2013.01); *H01J 37/32174* (2013.01); *H01J 37/32357* (2013.01); *H01J 37/32449* (2013.01); *H01J 37/32724* (2013.01); *H01L 21/02164* (2013.01); *H01L 21/02208* (2013.01); *H01L 21/02274* (2013.01); *H01J 2237/20214* (2013.01); *H01J 2237/3321* (2013.01)

(56) References Cited

U.S. PATENT DOCUMENTS

| | | |
|---|---|---|
| 9,309,594 B2 | 4/2016 | Hoffman et al. |
| 9,484,191 B2 | 11/2016 | Winkler |
| 10,319,862 B2 | 6/2019 | Ridgeway et al. |
| 2008/0268154 A1* | 10/2008 | Kher ................ C23C 16/56 427/255.34 |
| 2009/0104791 A1 | 4/2009 | Nemani et al. |
| 2011/0065276 A1 | 3/2011 | Ganguly et al. |
| 2016/0020139 A1 | 1/2016 | Teng et al. |
| 2016/0276148 A1 | 9/2016 | Qian et al. |

\* cited by examiner

METHODS AND APPARATUS FOR PROCESSING A SUBSTRATE

FIELD

Embodiments of the present disclosure generally relate to methods and apparatus for processing a substrate, and more particularly, to method and apparatus configured to form gap fill SiO film using in-situ plasma treatments.

BACKGROUND

Conventional methods and apparatus for gap fill SiO film use steam processes and/or one or more multi-step processes to develop stable SiO film, e.g., to meet platform requirements. For example, some methods use one or more deposition methods (e.g., chemical vapor deposition, DED furnace, etc.) to deposit the SiO film, followed by one or more other processes, such as, steam anneal or complex multi-step approach (e.g., ultraviolet (UV) cure, chemical mechanical polish (CMP), plasma treatment, etc.). Such methods, however, have structural issues (e.g., line bending), provide poor gap fill (e.g., porous (seams/voids)), can be very complicated and expensive, have low throughput, and often exceed thermal budget.

SUMMARY

Methods and apparatus for processing a substrate are provided herein. In some embodiments, a method for processing a substrate includes supplying a vaporized precursor from a gas supply into a processing volume of a processing chamber, supplying activated elements including ions and radicals from a remote plasma source, energizing the activated elements using RF source power at a first duty cycle to react with the vaporized precursor to deposit an $SiNH_x$ film onto a substrate supported on a substrate support disposed in the processing volume, supplying a first process gas from the remote plasma source while providing RF bias power at a second duty cycle different from the first duty cycle to the substrate support to convert the $SiNH_x$ film to an SiOx film, supplying a process gas mixture formed from a second process gas supplied from the remote plasma source and a third process gas supplied from the gas supply while providing RF bias power at the second duty cycle to the substrate support, and annealing the substrate.

In accordance with at least some embodiments, a non-transitory computer readable storage medium having stored thereon instructions that when executed by a processor performs a method for processing a substrate. The method includes supplying a vaporized precursor from a gas supply into a processing volume of a processing chamber, supplying activated elements including ions and radicals from a remote plasma source, energizing the activated elements using RF source power at a first duty cycle to react with the vaporized precursor to deposit an $SiNH_x$ film onto a substrate supported on a substrate support disposed in the processing volume, supplying a first process gas from the remote plasma source while providing RF bias power at a second duty cycle different from the first duty cycle to the substrate support to convert the $SiNH_x$ film to an SiOx film, supplying a process gas mixture formed from a second process gas supplied from the remote plasma source and a third process gas supplied from the gas supply while providing RF bias power at the second duty cycle to the substrate support, and annealing the substrate.

In accordance with at least some embodiments, a chemical vapor deposition chamber for processing a substrate includes a substrate support disposed in a processing volume of the chemical vapor deposition chamber, a remote plasma source coupled to the chemical vapor deposition chamber and configured to provide activated elements to a showerhead in the processing volume, an RF source power coupled to the showerhead and configured to provide RF source power at a first duty cycle, an RF bias power source coupled to the substrate support and configured to provide RF bias power at a second duty cycle different from the first duty cycle to the substrate support, a gas supply coupled to the chemical vapor deposition chamber and configured to supply process gas to the showerhead disposed in the processing volume, and a controller configured to supply a vaporized precursor from the gas supply into the processing volume of the chemical vapor deposition chamber, supply activated elements including ions and radicals from the remote plasma source, energize the activated elements using RF source power at the first duty cycle to react with the vaporized precursor to deposit an $SiNH_x$ film onto a substrate supported on the substrate support disposed in the processing volume, supply a first process gas from the remote plasma source while providing RF bias power at the second duty cycle to the substrate support to convert the $SiNH_x$ film to an SiOx film, supply a process gas mixture formed from a second process gas supplied from the remote plasma source and a third process gas supplied from the gas supply while providing RF bias power at the second duty cycle to the substrate support, and anneal the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
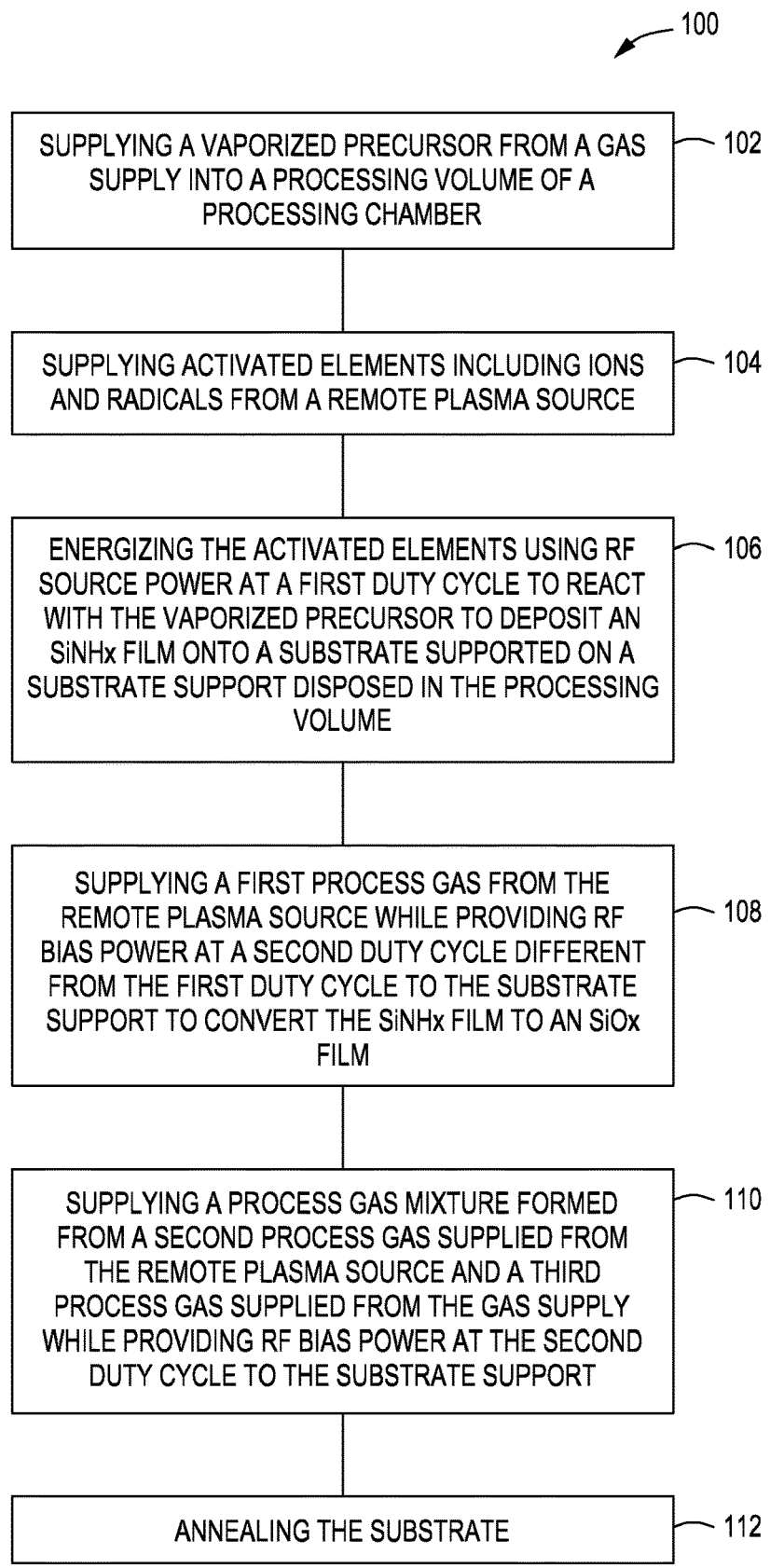
FIG. 1 is a flowchart of a method of processing a substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatus for processing a substrate are provided herein. For example, methods and apparatus described herein use in-situ $O_2$-based treatment to convert $SiNH_x$ to $SiO_x$ bonds to form SiO network and densify SIO film in a deposition chamber. When compared to conventional methods and apparatus, the methods and apparatus described herein provide low cost and high throughput, e.g., due to a less number of chambers needed to convert and stabilize SiO film, use low temperature SiO conversion to improve flowability and avoid void/conformality issues, and provide film composition tunability by varying treatment conditions.

Figure 2:
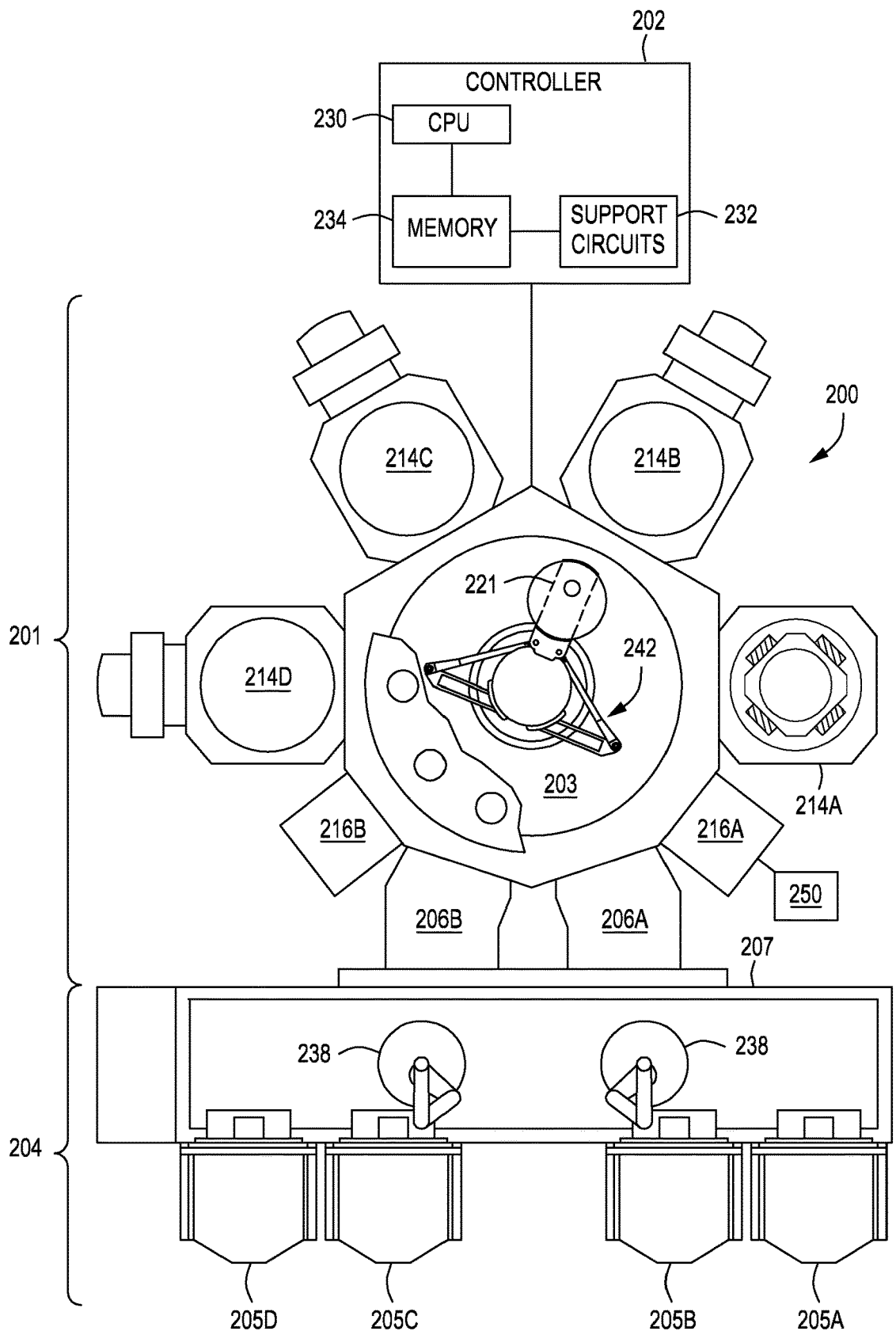
FIG. 2 is a diagram of an apparatus in accordance with at least some embodiments of the present disclosure.

FIG. 1 is a flowchart of a method 100 for processing a substrate, and FIG. 2 is a tool 200 (or apparatus) that can used for carrying out the method 100, in accordance with at least some embodiments of the present disclosure.

The method 100 may be performed in the tool 200 including any suitable processing chambers configured for one or more of physical vapor deposition (PVD), chemical vapor deposition (CVD), such as plasma-enhanced CVD (PECVD), flowable CVD (FCVD), and/or atomic layer deposition (ALD), such as plasma-enhanced ALD (PEALD) or thermal ALD (e.g., no plasma formation), anneal chambers, pre-clean chambers, wet etch of dry etch chambers, or CMP chambers. Exemplary processing systems that may be used to perform the inventive methods disclosed herein are commercially available from Applied Materials, Inc., of Santa Clara, California. Other processing chambers, including those from other manufacturers, may also be suitably used in connection with the teachings provided herein.

The tool 200 can be embodied in individual processing chambers that may be provided in a standalone configuration or as part of a cluster tool, for example, an integrated described below with respect to FIG. 2. Examples of the integrated tool are available from Applied Materials, Inc., of Santa Clara, California. The methods described herein may be practiced using other cluster tools having suitable processing chambers coupled thereto, or in other suitable processing chambers. For example, in some embodiments, the inventive methods may be performed in an integrated tool such that there are limited or no vacuum breaks between processing steps. For example, reduced vacuum breaks may limit or prevent contamination (e.g., oxidation) of portions of a substrate.

The integrated tool includes a processing platform 201 (vacuum-tight processing platform), a factory interface 204, and a controller 202. The processing platform 201 comprises multiple processing chambers, such as 214A, 214B, 214C, and 2140 operatively coupled to a transfer chamber 203 (vacuum substrate transfer chamber). The factory interface 204 is operatively coupled to the transfer chamber 203 by one or more load lock chambers (two load lock chambers, such as 206A and 2068 shown in FIG. 2).

In some embodiments, the factory interface 204 comprises a docking station 207, a factory interface robot 238 to facilitate the transfer of one or more semiconductor substrates (wafers). The docking station 207 is configured to accept one or more front opening unified pod (FOUP). Four FOUPS, such as 205A, 2058, 205C, and 2050 are shown in the embodiment of FIG. 2. The factory interface robot 238 is configured to transfer the substrates from the factory interface 204 to the processing platform 201 through the load lock chambers, such as 206A and 2068. Each of the load lock chambers 206A and 2068 have a first port coupled to the factory interface 204 and a second port coupled to the transfer chamber 203. The load lock chamber 206A and 2068 are coupled to a pressure control system (not shown) which pumps down and vents the load lock chambers 206A and 2068 to facilitate passing the substrates between the vacuum environment of the transfer chamber 203 and the substantially ambient (e.g., atmospheric) environment of the factory interface 204. The transfer chamber 203 has a vacuum robot 242 disposed within the transfer chamber 203. The vacuum robot 242 is capable of transferring substrates 221 between the load lock chamber 206A and 206B and the processing chambers 214A, 2148, 214C, and 214D.

In some embodiments, the processing chambers 214A, 2148, 214C, and 214D, are coupled to the transfer chamber 203. The processing chambers 214A, 214B, 214C, and 214D comprise at least an ALD chamber, a CVD chamber, a PVD chamber, an e-beam deposition chamber, an electroplating, electroless (EEP) deposition chamber, a pre-clean chamber, a wet etch chamber, a dry etch chamber, an anneal chamber, and/or other chamber suitable for performing the methods described herein.

In some embodiments, one or more optional service chambers (shown as 216A and 216B) may be coupled to the transfer chamber 203. The service chambers 216A and 216B may be configured to perform other substrate processes, such as degassing, bonding, chemical mechanical polishing (CMP), wafer cleaving, etching, plasma dicing, orientation, substrate metrology, cool down and the like.

The controller 202 controls the operation of the tool 200 using a direct control of the processing chambers 214A, 214B, 214C, and 214D or alternatively, by controlling the computers (or controllers) associated with the processing chambers 214A, 214B, 214C, and 214D and the tool 200. In operation, the controller 202 enables data collection and feedback from the respective chambers and systems to optimize performance of the tool 200. The controller 202 generally includes a central processing unit 230, a memory 234, and a support circuit 232. The central processing unit 230 may be any form of a general-purpose computer processor that can be used in an industrial setting. The support circuit 232 is conventionally coupled to the central processing unit 230 and may comprise a cache, clock circuits, input/output subsystems, power supplies, and the like. Software routines, such as processing methods as described above may be stored in the memory 234 (e.g., non-transitory computer readable storage medium having instructions stored thereon) and, when executed by the central processing unit 230, transform the central processing unit 230 into a controller (specific purpose computer). The software routines may also be stored and/or executed by a second controller (not shown) that is located remotely from the tool 200.

Figure 3:
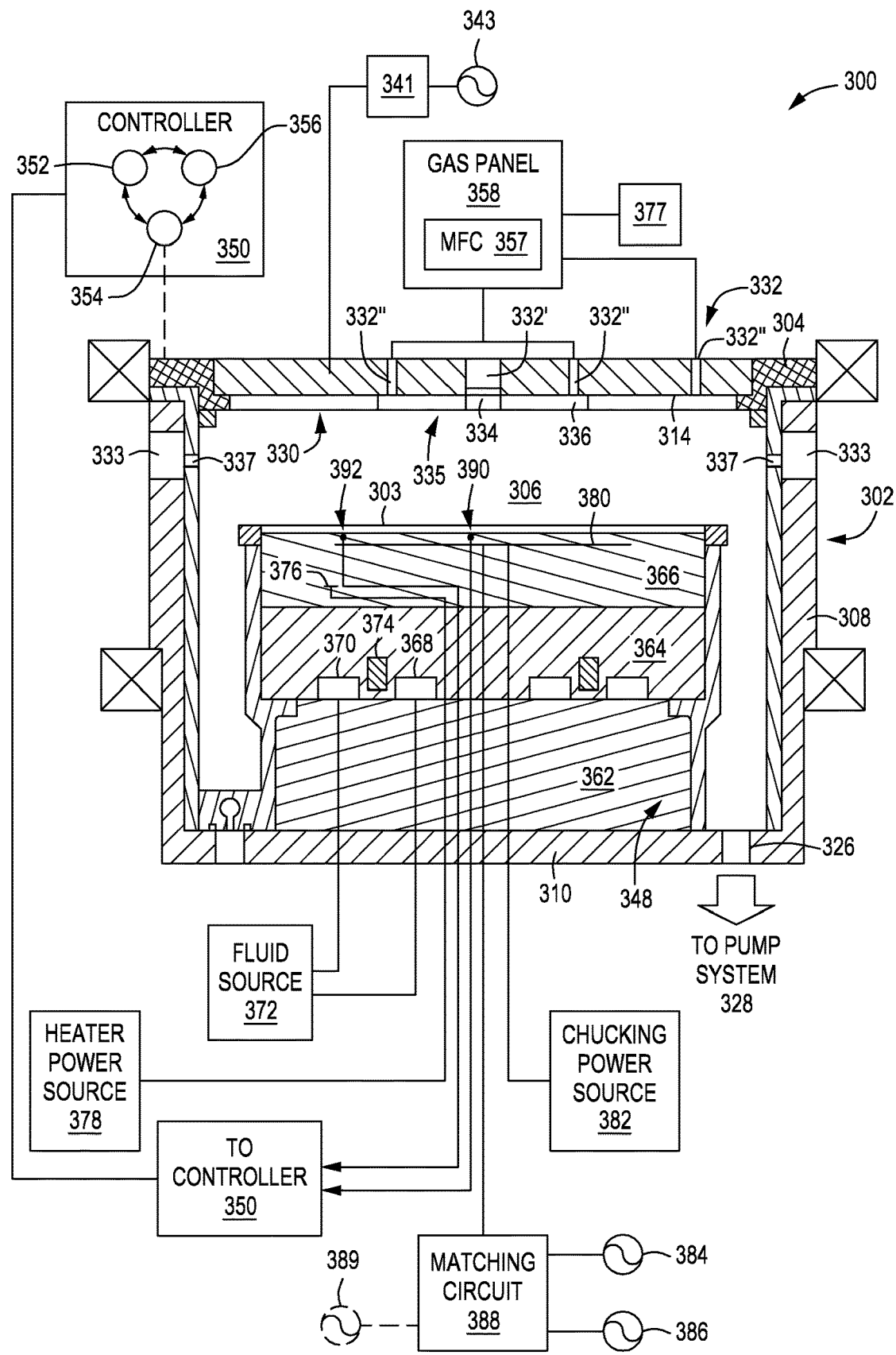
FIG. 3 is a sectional diagram of a processing chamber in accordance with at least some embodiments of the present disclosure.

FIG. 3 is a sectional diagram of a processing chamber 300 in accordance with at least some embodiments of the present disclosure. The processing chamber 300 can one of the individual processing chamber of the tool 200. For example, the processing chamber 300 can be configured to perform one or more plasma deposition processes. In at least some embodiments, the processing chamber 300 can be configured to perform PECVD and/or ALD. Suitable processing chambers that may be adapted for use with the teachings disclosed herein include, for example, processing chambers available from Applied Materials, Inc. of Santa Clara, CA.

The processing chamber 300 includes a chamber body 302 and a lid 304 which enclose a processing volume 306. The chamber body 302 is typically fabricated from aluminum, stainless steel or other suitable material. The chamber body 302 generally includes sidewalls 308 and a bottom 310. A substrate support access port (not shown) is generally defined in a sidewall 308 and is selectively sealed by a slit valve to facilitate entry and egress of a substrate 303 from the processing chamber 300. An exhaust port 326 is defined in the chamber body 302 and couples the processing volume 306 to a pump system 328, which can also function as a purge station. The pump system 328 generally includes one or more pumps and throttle valves utilized to evacuate and regulate the pressure of the processing volume 306 of the processing chamber 300. In embodiments, the pump system 328 is configured to maintain the pressure inside the processing volume 306 at operating pressures typically between about 1 mTorr to about 500 mTorr, between about 5 mTorr to about 100 mTorr, between about 5 mTorr to about 50 mTorr, or between 10 mTorr to about 5 Torr, depending upon process needs.

In some embodiments, the processing chamber 300 may utilize capacitively coupled RF energy for plasma processing, or in some embodiments, processing chamber 300 may use inductively coupled RF energy for plasma processing. In some embodiments, a remote plasma source 377 (e.g., microwave) may be optionally coupled to a gas panel to facilitate dissociating gas mixture from a remote plasma prior to entering the processing volume 306 for processing or for a cleaning the processing chamber 300 between processes. The remote plasma source 377 can supply activated elements (e.g., ions, radicals, or neutrals) to the processing chamber 300. For example, in at least some embodiments, the activated elements can be formed from at least one of ammonia, argon, oxygen ($O_2$), helium. For example, in at least some embodiments, the activated elements can be ammonia radicals or argon ions.

An RF source power 343 is coupled through a matching network 341 to the showerhead assembly 330. The RF source power 343 typically can produce up to about 5000 W, for example between about 100 W to about 5000 W, or between 1000 W to 3000 W, or about 1500 W and optionally at a tunable frequency in a range from about 50 kHz to about 200 MHz, e.g., 13.56 MHz. The RF source power 343 can operate at a duty cycle (e.g., a first duty cycle) during processing. The duty cycle can be about 10% for pulsed to about 100% for continuous.

A gas panel 358 is coupled to the processing chamber 300 and includes one or more mass flow controllers 357 to provide one or more process and/or cleaning gases to the processing volume 306. Inlet ports 332', 332", 332'" are provided in the lid 304 to allow gases to be delivered from the gas panel 358 to the processing volume 306 of the processing chamber 300. In embodiments, the gas panel 358 is adapted to provide oxygen ($O_2$), an inert gas such as argon, helium (or other noble gas), nitrogen ($N_2$), hydrogen ($H_2$) or a gas mixture such as carbon tetrafluoride ($CF_4$), octafluorocyclobutane or perfluorocyclobutane ($C_4F_8$), trifluoromethane ($CHF_3$), sulfur hexafluoride ($SF_6$), silicon tetrafluoride or tetrafluorosilane ($SiF_4$), a precursor, such as trisilylamine (TSA), etc., through the inlet ports 332', 332", 332'" and into the interior volume 306 of the processing chamber 300. In at least some embodiments, the process gas provided from the gas panel 358 includes at least a process gas including an oxidizing agent such as oxygen gas. In embodiments, the process gas including an oxidizing agent may further comprise an inert gas such as argon or helium. In some embodiments, the process gas includes a reducing agent such as hydrogen and may be mixed with an inert gas such as argon, or other gases such as nitrogen or helium. In some embodiments, a chlorine gas may be provided alone, or in combination with at least one of nitrogen, helium an inert gas such as argon. Non-limiting examples of oxygen containing gas includes one or more of $O_2$, carbon dioxide ($CO_2$), $H_2O$, nitrous oxide ($N_2O$), nitrogen dioxide ($NO_2$), ozone ($O_3$), and the like. Non-limiting examples of nitrogen containing gas includes $N_2$, ammonia ($NH_3$), and the like. Non-limiting examples of chlorine containing gas includes hydrogen chloride (HCl), chlorine ($Cl_2$), carbon tetrachloride ($CCl_4$), and the like. In embodiments, a showerhead assembly 330 is coupled to an interior surface 314 of the lid 304. The showerhead assembly 330 includes a plurality of apertures that allow the gases flowing through the showerhead assembly 330 from the inlet ports 332', 332", 332'" into the processing volume 106 of the processing chamber 100 in a predefined distribution across the surface of the substrate 303 (e.g., center, middle, side) being processed in the processing chamber 300.

In one embodiment, the showerhead assembly 330 is configured with a plurality of zones that allow for separate control of gas flowing into the processing volume 306 of the processing chamber 300. The showerhead assembly 330 comprises a top delivery gas nozzle 335 that is configured to direct the process gas toward a substrate support surface of the substrate support 348. Accordingly, the top delivery gas nozzle 335 includes a center flow outlet 334 configured for center flow control and a middle flow outlet 336 configured for middle flow control that are separately coupled to the gas panel 358 through inlet ports 332', 332". Additionally, one or more side delivery gas nozzles can extend through the chamber body 302 and can be configured to direct the process gas toward a side surface of the substrate support 348. For example, in at least some embodiments, a side delivery gas nozzle 333 can include side flow outlets 337 configured for side flow control that is separately coupled to the gas panel 358 through the inlet port 332'. Unlike the center flow outlet 334 and the middle flow outlet 336 which are disposed on the lid 304, the side flow outlets 337 are disposed along an interior of the sidewalls 308 of the processing chamber in a generally circular manner. The center flow outlet 334 and the middle flow outlet 336 are configured to provide process gas to substantially etch a center zone and a middle zone (e.g., between the center and an edge) of a substrate, and the side flow outlets 337 that are disposed along are configured to provide process gas to substantially etch an edge area (or perimeter) of a substrate.

The substrate support 348 is disposed in the processing volume 306 of the processing chamber 300 below the gas distribution assembly such as showerhead assembly 330. For example, the substrate support 348 can be disposed below the showerhead assembly 330 such that a substrate is about 3 inches below the showerhead assembly 330. The substrate support 348 holds the substrate 303 during processing. The substrate support 348 generally includes a plurality of lift pins (not shown) disposed therethrough that are configured to lift the substrate 303 from the substrate support 348 and facilitate exchange of the substrate 303 with a robot (not shown) in a conventional manner. An inner liner 318 may closely circumscribe the periphery of the substrate support 348.

The substrate support 348 includes a mounting plate 362, a base 364 and an electrostatic chuck 366. The mounting plate 362 is coupled to the bottom 310 of the chamber body 302 includes passages for routing utilities, such as fluids, power lines and sensor leads, among others, to the base 364 and the electrostatic chuck 366. The electrostatic chuck 366 comprises the clamping electrode 380 for retaining the substrate 33 below showerhead assembly 330. The electrostatic chuck 366 is driven by a chucking power source 382 to develop an electrostatic force that holds the substrate 303 to the chuck surface, as is conventionally known. Alternatively, the substrate 303 may be retained to the substrate support 348 by clamping, vacuum, or gravity. In at least some embodiments the substrate support 348 call be rotatable.

A base 364 or electrostatic chuck 366 may include heater 376 (e.g., at least one optional embedded heater), at least one optional embedded isolator 374 and a plurality of conduits 368, 370 to control the lateral temperature profile of the substrate support 348. The plurality of conduits 368, 370 are fluidly coupled to a fluid source 372 that circulates a temperature regulating fluid therethrough. The heater 376 is regulated by a power source 378. The plurality of conduits 368, 370 and heater 376 are utilized to control the temperature of the base 364, heating and/or cooling the electrostatic chuck 366 and ultimately, the temperature profile of the substrate 303 disposed thereon. The temperature of the electrostatic chuck 366 and the base 364 may be monitored using a plurality of temperature sensors 390, 392. The electrostatic chuck 366 may further include a plurality of gas passages (not shown), such as grooves, that are formed in a substrate support pedestal supporting surface of the electrostatic chuck 366 and fluidly coupled to a source of a heat transfer (or backside) gas, such as helium (He). In operation, the backside gas is provided at controlled pressure into the gas passages to enhance the heat transfer between the electrostatic chuck 366 and the substrate 303. In embodiments, the temperature of the substrate may be maintained at about −20° C. to about 450° C. For example, in at least some embodiments, the substrate may be maintained at about −20° C. to about 90° C.

The substrate support 348 is configured as a cathode and includes a clamping electrode 380 that is coupled to the RF bias power source 384 and RF bias power source 386. The RF bias power source 384 and RF bias power source 386 are coupled between the clamping electrode 380 disposed in the substrate support 348 and another electrode, such as the showerhead assembly 330 or (lid 304) of the chamber body 302. The RF bias power excites and sustains a plasma discharge formed from the gases disposed in the processing region of the chamber body 302.

The RF bias power source 384 and RF bias power source 386 are coupled to the clamping electrode 380 disposed in the substrate support 348 through a matching circuit 388. The signal generated by the RF bias power source 384 and RF bias power source 386 is delivered through matching circuit 388 to the substrate support 348 through a single feed to ionize the gas mixture provided in the plasma processing chamber such as processing chamber 300, thus providing ion energy necessary for performing an etch, deposition or other plasma enhanced process. The RF bias power source 384 and RF bias power source 386 are generally capable of producing an RF signal having a frequency of from about 50 kHz to about 200 MHz (e.g., 2 MHz) and a power between about 0 Watts and about 2500 Watts. An additional bias power 389 may be coupled to the clamping electrode 380 to control the characteristics of the plasma. Additionally, the RF bias power source 384 and the RF bias power source 386 can operate at a duty cycle (e.g., a second duty cycle) that is much less than a duty cycle that the RF source power 343 operates at. For example, the RF bias power source 384 and the RF bias power source 386 can operate at a duty cycle of about 0.1% to about 20%. In at least some embodiments, an on time of the duty cycle of the RF bias power source 384 and the RF bias power source 386 has pulsing frequency of about 1 Hz to about 20 Hz.

A controller 350 (e.g., similar to the controller 202) is coupled to the processing chamber 300 to control operation of the processing chamber 300. The controller 350 includes a central processing unit 352, a memory 354 (e.g., a non-transitory computer readable storage medium), and a support circuit 356 utilized to control the process sequence and regulate the gas flows from the gas panel 358. The central processing unit 352 may be any form of general-purpose computer processor that may be used in an industrial setting.

The software routines (e.g., executable instructions stored) can be stored in the memory 354, such as random-access memory, read only memory, floppy, or hard disk drive, or other form of digital storage. The support circuit 356 is conventionally coupled to the central processing unit 352 and may include cache, clock circuits, input/output systems, power supplies, and the like. Bi-directional communications between the controller 350 and the various components of the processing chamber 300 are handled through numerous signal cables.

Continuing with reference to FIG. 1, at 102, the method 100 comprises supplying a vaporized precursor from a gas supply into a processing volume of a processing chamber. For example, the gas panel 358 can supply one or more vaporized precursors into the processing volume 306 of the processing chamber 300 (e.g., one of the processing chambers 214A-214D) to deposit (develop) gap fill film (e.g., a flowable silicon film, such as $SiO_x$) on a substrate (e.g., the substrate 303). In at least some embodiments, the gas panel 358 can supply a vaporized precursor comprising trisilylamine (TSA) to form a siliazane-like film ($SiNH_x$).

Next, at 104, the method 100 comprises supplying activated elements including ions and radicals from a remote plasma source. For example, the remote plasma source 377 can supply one or more activated elements including argon, hydrogen ($H_2$), ammonia ($NH_3$), and/or oxygen ($O_2$). For example, in at least some embodiments, the activated elements can include at least one of ammonia radicals ($NH_x$), $H_2$ radicals, and argon ions.

Next, at 106, the method 100 comprises energizing the activated elements using RF source power at a first duty cycle to react with the vaporized precursor to deposit a film onto a substrate supported on a substrate support disposed in the processing volume. For example, the ammonia radicals can be energized via argon ions (e.g., from the remote plasma source) and caused to react with the vaporized precursor (e.g., TSA). The reaction between the ammonia radicals and the vaporized precursor deposits a flowable polysilazane-based film (SiNHx) onto the substrate. During 106, the RF source power 343 can be about 100 W to about 5000 W. For example, in at least some embodiments, the RF source power 343 can be about 100 W and at a tunable frequency in a range from about 50 kHz to about 200 MHz (e.g., 13.56 MHz). Additionally, the RF source power 343 can operate at a duty cycle of about 10% for pulsed to about 100% for continuous. Moreover, at 106 a temperature of the substrate can be maintained at about −20° C. to about 90° C. In at least some embodiments, the temperature of the substrate can be maintained at about 20° C., e.g., about room temperature. Furthermore, at 106 a pressure within the processing volume of the processing chamber can be maintained at a pressure of about 10 mTorr to 5 Torr.

Next, at 108, the method 100 comprises supplying a first process gas from the remote plasma source while providing RF bias power at a second duty cycle different from the first duty cycle to the substrate support. For example, the remote plasma source 377 can supply one or more oxygen containing gases to the processing volume 306 of the processing chamber 300. In at least some embodiments, the one or more oxygen containing gases can be $O_2$. The $O_2$ can be supplied into the processing volume 306 to convert the SiNHx to SiOx, e.g., forming SiOx networks on a substrate. Additionally, at 108 the RF bias power source 384 can operate at a duty cycle of about 0.1% to about 20%, can operate at a power level of about 500 W to about 2500 W (e.g., about 2000 W), and at a pulsing frequency of about 1 Hz to about 20 Hz. At 108, the RF source power and the RF bias power can be provided simultaneously to the showerhead 330 (or the lid 304) and to the substrate support 348, respectively.

Next, at 110, the method 100 comprises supplying a process gas mixture formed from a second process gas supplied from the remote plasma source and a third process gas supplied from the gas supply while providing RF bias power at the second duty cycle to the substrate support. For example, the remote plasma source 377 can supply one or more inert (noble) gases. In at least some embodiments, the remote plasma source 377 can supply argon. Similarly, the gas panel 358 can also supply one or more inert gases. In at least some embodiments, the gas panel 358 can supply helium. Alternatively or additionally, each of the remote plasma source 377 and the gas panel 358 can be configured to supply both the second process gas and the third process gas. Other inert gases can also be used. The inventors have found that by supplying the gas mixture at 110 while simultaneously providing RF source power at a first duty cycle to showerhead and RF bias power at the second duty cycle to the substrate support facilitates SiOx film densification and stabilization, which helps the SiOx film withstand post deposition high temperature/pressure anneal processes, as described below. In at least some embodiments, one or more additional gases may also be provided during 108 and 110. For example, one or more hydrogen containing gases can be provided. In at least some embodiments, $H_2$ can be provided while the $O_2$ is supplied at 108 and/or while the process gas mixture is supplied at 110.

In at least some embodiments, the RF source power and the RF bias power can be provided sequentially in a closed looped gas process scheme. For example, in at least some embodiments, after 110, 102-110 can be repeated (e.g., in a cyclic mode) as necessary until a desired thickness of the SiOx film is achieved. To that end, process parameters, such as thickness per cycle and treatment conditions (e.g., source/bias power, pulsing frequency, duty cycle, process gas, temperature, pressure, on-time, etc.), can be varied to tune SiOx film composition. Moreover, to facilitate obtaining a uniform SiOx film, the substrate support 348 can be rotated during any of 102-110. For example, during 108 and 110 the substrate support 348 can be rotated.

The SiOx film quality can be further improved by a high temperature/pressure anneal that helps to increase the refractive index and reduce a hydrogen content throughout a full thickness of the SiOx film. Accordingly, at 112, the method 100 comprises annealing the substrate. For example, after 110, the vacuum robot 242 disposed within the transfer chamber 203 of the tool 200 can transfer the substrate 303 from the processing chamber 300 (e.g., the processing chamber 214A) to one or more of the other processing chambers (e.g., the processing chamber 214B) to anneal the substrate. In at least some embodiments, annealing the substrate comprises maintaining the substrate at a temperature of about 500° C., maintaining a processing volume of the processing chamber 214B at a pressure of about 10 mTorr to about 37500 Torr (70 Bar), and supplying one or more process gases. e.g., Ar, $CO_2$, $D_2$, $H_2$, $N_2$, and $O_2$, to the processing volume during annealing.

While the foregoing is directed to embodiments of the present disclosure, other and further embodiments of the disclosure may be devised without departing from the basic scope thereof.

The invention claimed is:

1. A method for processing a substrate, comprising:
supplying a vaporized precursor from a gas supply into a processing volume of a processing chamber;
supplying activated elements including ions and radicals from a remote plasma source;
energizing the activated elements using RF source power at a first duty cycle to react with the vaporized precursor to deposit an SiNHx film onto a substrate supported on a substrate support disposed in the processing volume;
supplying a first process gas from the remote plasma source while providing RF bias power at a second duty cycle different from the first duty cycle to the substrate support to convert the SiNHx film to an SiOx film;
supplying a process gas mixture formed from a second process gas supplied from the remote plasma source and a third process gas supplied from the gas supply while simultaneously providing the RF source power at the first duty cycle and the RF bias power at the second duty cycle to a showerhead and to the substrate support, respectively, to facilitate SiOx film densification and stabilization and withstand post deposition high temperature/pressure anneal processes; and
annealing the substrate.

2. The method of claim 1, wherein the first duty cycle is about 10% to about 100%, and wherein the second duty cycle is about 0.1% to about 20%, and wherein an on time of the second duty cycle has pulsing frequency of about 1 Hz to about 20 Hz.

3. The method of claim 1, wherein annealing the substrate comprises heating the substrate to a temperature of about 500° C.

4. The method of claim 1, further comprising sequentially providing the RF source power and the RF bias power in a closed looped gas process scheme.

5. The method of claim 1, further comprising rotating the substrate support.

6. The method of claim 1, further comprising maintaining a temperature of the substrate at about −20° C. to about 90 C while supplying the activated elements.

7. The method of claim 1, further comprising maintaining a pressure of about 10 mTorr to 5 Torr while supplying the activated elements.

8. The method of claim 1, wherein the processing chamber is a plasma-enhanced chemical vapor deposition chamber.

9. The method of claim 1, wherein the RF source power is about 100 W, and
wherein the RF bias power is about 500 W to about 2500 W.

10. The method of claim 1, wherein supplying the activated elements from the remote plasma source comprises supplying at least one of ammonia radicals, H2 radicals, or argon ions.

11. The method of claim 1, wherein supplying the first process gas comprises supplying oxide.

12. The method of claim 1, wherein supplying the second process gas and the third process gas comprises supplying argon and helium, respectively.

13. The method of claim 1, wherein supplying the vaporized precursor comprises supplying trisilylamine.

14. A non-transitory computer readable storage medium having stored thereon instructions that when executed by a processor perform a method for processing a substrate, comprising:
supplying a vaporized precursor from a gas supply into a processing volume of a processing chamber;
supplying activated elements including ions and radicals from a remote plasma source;

energizing the activated elements using RF source power at a first duty cycle to react with the vaporized precursor to deposit an SiNHx film onto a substrate supported on a substrate support disposed in the processing volume;

supplying a first process gas from the remote plasma source while providing RF bias power at a second duty cycle different from the first duty cycle to the substrate support to convert the SiNHx film to an SiOx film;

supplying a process gas mixture formed from a second process gas supplied from the remote plasma source and a third process gas supplied from the gas supply while simultaneously providing the RF source power at the first duty cycle and the RF bias power at the second duty cycle to a showerhead and to the substrate support, respectively, to facilitate SiOx film densification and stabilization and withstand post deposition high temperature/pressure anneal processes; and annealing the substrate.

15. The non-transitory computer readable storage medium of claim 14, wherein the first duty cycle is about 10% to about 100%, and wherein the second duty cycle is about 0.1% to about 20%, and wherein an on time of the second duty cycle has pulsing frequency of about 1 Hz to about 20 Hz.

16. The non-transitory computer readable storage medium of claim 14, wherein annealing the substrate comprises heating the substrate to a temperature of about 5000 C.

17. The non-transitory computer readable storage medium of claim 14, further comprising sequentially providing the RF source power and the RF bias power in a closed looped gas process scheme.

18. A chemical vapor deposition chamber for processing a substrate, comprising:

a substrate support disposed in a processing volume of the chemical vapor deposition chamber;

a remote plasma source coupled to the chemical vapor deposition chamber and configured to provide activated elements to a showerhead in the processing volume;

an RF source power coupled to the showerhead and configured to provide RF source power at a first duty cycle;

an RF bias power source coupled to the substrate support and configured to provide RF bias power at a second duty cycle different from the first duty cycle to the substrate support;

a gas supply coupled to the chemical vapor deposition chamber and configured to supply process gas to the showerhead disposed in the processing volume; and a controller configured to:

supply a vaporized precursor from the gas supply into the processing volume of the chemical vapor deposition chamber;

supply activated elements including ions and radicals from the remote plasma source;

energize the activated elements using RF source power at the first duty cycle to react with the vaporized precursor to deposit an SiNHx film onto a substrate supported on the substrate support disposed in the processing volume;

supply a first process gas from the remote plasma source while providing RF bias power at the second duty cycle to the substrate support to convert the SiNHx film to an SiOx film;

supply a process gas mixture formed from a second process gas supplied from the remote plasma source and a third process gas supplied from the gas supply while simultaneously providing the RF source power at the first duty cycle and the RF bias power at the second duty cycle to a showerhead and to the substrate support, respectively, to facilitate SiOx film densification and stabilization and withstand post deposition high temperature/pressure anneal processes; and anneal the substrate.

* * * * *